(12) United States Patent
Tsuchiya

(10) Patent No.: US 10,207,484 B2
(45) Date of Patent: Feb. 19, 2019

(54) MANUFACTURING METHOD OF JOINED BODY, MANUFACTURING METHOD OF MEMS DEVICE, MANUFACTURING METHOD OF LIQUID EJECTING HEAD, AND MANUFACTURING DEVICE OF JOINED BODY

(71) Applicant: SEIKO EPSON CORPORATION, Tokyo (JP)

(72) Inventor: Hiroyuki Tsuchiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/660,643

(22) Filed: Jul. 26, 2017

(65) Prior Publication Data

US 2018/0050530 A1 Feb. 22, 2018

(30) Foreign Application Priority Data

Aug. 19, 2016 (JP) .................................. 2016-161045
Dec. 20, 2016 (JP) .................................. 2016-246277

(51) Int. Cl.
 *B41J 2/16* (2006.01)
 *B81C 3/00* (2006.01)
 *C09J 5/00* (2006.01)
 *B32B 37/12* (2006.01)

(52) U.S. Cl.
 CPC ............... *B32B 37/12* (2013.01); *B41J 2/161* (2013.01); *B41J 2/1612* (2013.01); *B41J 2/1623* (2013.01); *B41J 2/1628* (2013.01); *B81C 3/001* (2013.01); *C09J 5/00* (2013.01); *B32B 2307/538* (2013.01); *B81B 2201/052* (2013.01); *B81C 2203/032* (2013.01)

(58) Field of Classification Search
 CPC ... B32B 37/12; B32B 2307/538; B81C 3/001; B81C 2203/032; B41J 2/1612; B41J 2/1623; B81B 2201/052
 USPC ............................ 156/64, 350, 351, 378, 379
 See application file for complete search history.

(56) References Cited

U.S. PATENT DOCUMENTS

2014/0023825 A1\* 1/2014 Igarashi .................... C09J 7/381
428/141
2015/0239223 A1 8/2015 Tsuchiya

FOREIGN PATENT DOCUMENTS

| JP | 2015-157386 | 9/2015 |
| JP | 2015-160384 | 9/2015 |
| JP | 2015-160385 | 9/2015 |
| JP | 2015-166158 | 9/2015 |

\* cited by examiner

*Primary Examiner* — Michael N Orlando
*Assistant Examiner* — Joshel Rivera
(74) *Attorney, Agent, or Firm* — Workman Nydegger

(57) ABSTRACT

A manufacturing method of a joined body in which a plurality of structures are joined to each other, the method including forming of an adhesive layer on one face of a medium; adjusting of viscosity of the adhesive layer formed in the forming of the adhesive layer; transcribing the adhesive layer of which viscosity is adjusted in the adjusting of viscosity to the structure; and measuring of surface roughness of the adhesive layer on a transcribing film in a stage before the transcribing.

14 Claims, 8 Drawing Sheets

| PEAK INTENSITY | 0.1 | 0.5 | 1.0 | 15 | 20 |
|---|---|---|---|---|---|
| JOINING INTENSITY | × | × | × | ○ | ○ |

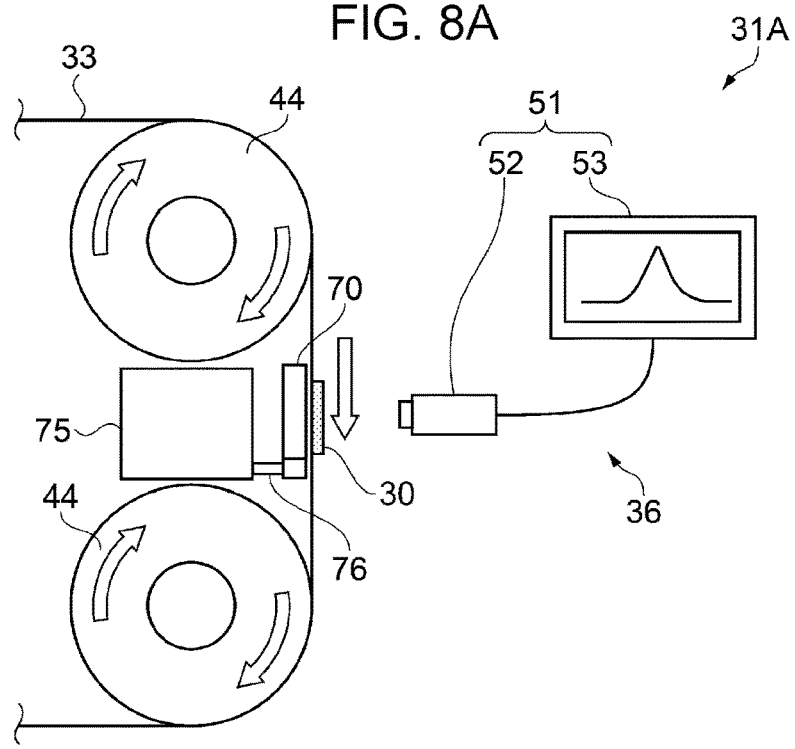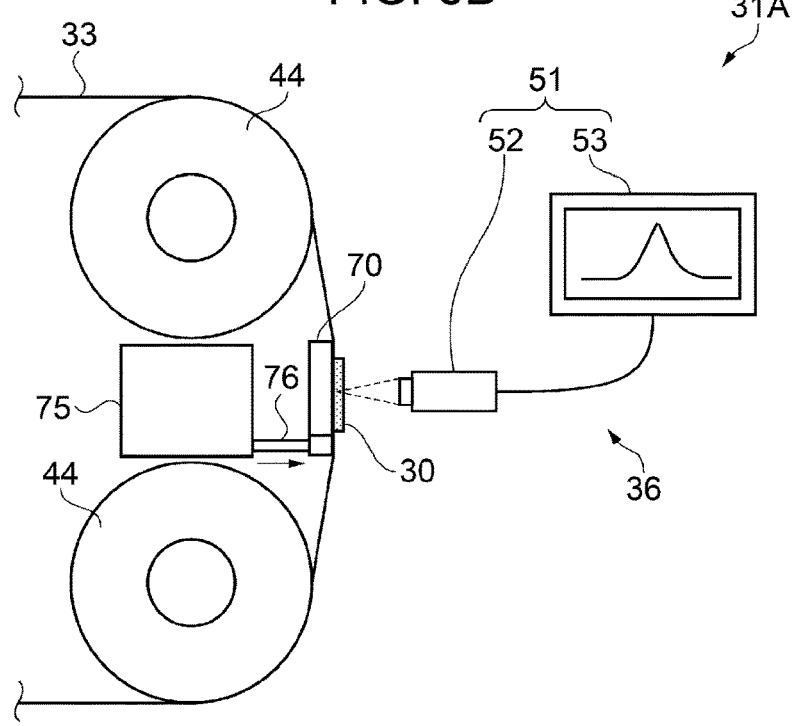

MANUFACTURING METHOD OF JOINED BODY, MANUFACTURING METHOD OF MEMS DEVICE, MANUFACTURING METHOD OF LIQUID EJECTING HEAD, AND MANUFACTURING DEVICE OF JOINED BODY

BACKGROUND

1. Technical Field

The present invention relates to a manufacturing method of a joined body, a manufacturing method of a MEMS device, a manufacturing method of a liquid ejecting head, and a manufacturing device of the joined body, and in particular, relates to a manufacturing method of a joined body in which a plurality of structures are joined by an adhesive, a manufacturing method of a MEMS device, a manufacturing method of a liquid ejecting head, and a manufacturing device of the joined body.

2. Related Art

A liquid ejecting apparatus is an apparatus provided with a liquid ejecting head, and ejects (discharges) various liquid from the ejecting head. As the liquid ejecting apparatus, for example, there is an image recording apparatus such as an ink jet printer or an ink jet plotter; however, in recent years, the liquid ejecting apparatus is also applied to various manufacturing devices by bringing the best of characteristics in which liquid of a very small amount can be accurately landed on a predetermined position. For example, the liquid ejecting apparatus is applied to a display manufacturing device which manufactures a color filter of a liquid display, and the like, an electrode forming device which forms an electrode of an organic electro luminescence (EL) display, a surface emission display (FED), and the like, and a chip manufacturing device which manufactures a biochip (biochemical element).

As the MEMS device which is used in the liquid ejecting head, there is a MEMS device which includes a joined body in which a plurality of structures (substrates) are joined by an adhesive in a state of being stacked. A liquid flow path which communicates with a nozzle, a movable region for ejecting liquid from a nozzle by causing a pressure change in liquid in the liquid flow path, and the like, are provided in each structure which configures the joined body. Since the MEMS device formed of such a joined body has a micro structure, a region to which an adhesive is applied also becomes extremely small. For this reason, in the related art, a manufacturing method in which an adhesive is transcribed to a structure, after applying the adhesive to a film, has been adopted related to joining of such structures which have a micro structure (for example, refer to JP-A-2015-160385.

However, there is a case in which a film thickness becomes uneven due to application unevenness, or the like, when applying an adhesive to a film, and in such a case, there has been a problem in that air bubbles are mixed into the adhesive between structures, and a bonding failure occurs.

SUMMARY

An advantage of some aspects of the invention is to provide a manufacturing method of a joined body in which it is possible to suppress a bonding failure in a joined body in advance, by further reliably detecting application unevenness of an adhesive in a configuration in which a plurality of structures are joined by the adhesive, and are set to a joined body, a manufacturing method of a MEMS device, a manufacturing method of a liquid ejecting head, and a manufacturing device of the joined body.

The advantage can be achieved by the following invention.

According to an aspect of the invention, there is provide a manufacturing method of a joined body in which a plurality of structures are joined to each other using an adhesive in a state of being stacked, the method including forming an adhesive layer on one face of a medium; adjusting viscosity of the adhesive layer formed in the forming of the adhesive layer; transcribing the adhesive layer of which viscosity is adjusted in the adjusting viscosity to the structure; in which measuring surface roughness of the adhesive layer on the medium in a stage before the transcribing is performed.

According to the method, it is possible to suppress an occurrence of a bonding failure in the joined body in advance, by measuring surface roughness of the adhesive layer on the medium in a stage before the transcribing.

In the method, in the measuring of the surface roughness, it is preferable to measure the surface roughness of the adhesive layer formed on the medium in a non-contact manner.

According to the method, it is possible to measure the surface roughness with good accuracy without giving damage to the adhesive layer, since measuring of surface roughness of the adhesive layer is performed on the adhesive layer in a non-contact manner in a manufacturing line. For this reason, it is possible to improve joining reliability of the joined body. In addition, it is possible to improve a manufacturing efficiency.

In the method, it is preferable to perform the transcribing in a case in which the surface roughness of the adhesive layer is smaller than a predetermined value which is set in advance, in the measuring of surface roughness.

According to the method, it is possible to perform measuring of surface roughness in a manufacturing line with good accuracy in a non-contact manner. For this reason, it is possible to improve joining reliability of the joined body. In addition, it is possible to improve a manufacturing efficiency.

In the method, in the transcribing, it is preferable to perform transcribing in a case in which light receiving intensity of reflected light when radiating light toward the adhesive layer is larger than a predetermined value which is set in advance, in the measuring of surface roughness.

According to the method, it is possible to perform measuring of surface roughness in a manufacturing line with good accuracy in a non-contact manner. For this reason, it is possible to improve joining reliability of the joined body. In addition, it is possible to improve a manufacturing efficiency.

In the method, it is preferable to perform the measuring of surface roughness between the forming of the adhesive layer and the adjusting of viscosity.

In this manner, by measuring surface roughness before viscosity of the adhesive layer is adjusted, it is possible to easily improve unevenness of the adhesive layer in a case in which there is a possibility of an occurrence of a bonding failure.

In the method, it is preferable to perform the measuring of surface roughness between the adjusting of viscosity and the transcribing.

In this manner, by measuring surface roughness after the viscosity of the adhesive layer is adjusted, it is possible to grasp surface roughness of the adhesive layer after a change also in a case in which there is the change in surface roughness of the adhesive layer after the adjusting of viscosity. In this manner, it is possible to further improve joining reliability of the joined body.

In the manufacturing method of the joined body, it is preferable to measure a thickness of the adhesive layer together, in the measuring of surface roughness.

According to the method, it is possible to improve a manufacturing efficiency by measuring the thickness of the adhesive layer together with measuring of surface roughness. In addition, it is possible to select an adhesive layer with a desired thickness, by grasping a thickness of the adhesive layer. As a result, it is possible to reduce jutting out of an adhesive from a joined portion in the joined body.

According to another aspect of the invention, there is provided a manufacturing method of a MEMS device which includes a joined body in which a plurality of structures are joined to each other using an adhesive in a state of being stacked, the method including manufacturing of the joined body using the manufacturing method of the joined body according to any one of the aspects.

According to the manufacturing method of the MEMS device, since separation between structures is suppressed in the joined body, it is possible to manufacture the MEMS device with high reliability.

According to still another aspect of the invention, there is provided a manufacturing method of a liquid ejecting head which includes a joined body in which a plurality of structures are joined to each other using an adhesive in a state of being stacked, and a liquid flow path is formed in the inside, the method including manufacturing of the joined body using the manufacturing method of the joined body according to any one of the aspects.

According to the manufacturing method of the liquid ejecting head, it is possible to manufacture a liquid ejecting head with high reliability, since leaking of liquid from a joined portion or separation is suppressed.

According to still further another aspect of the invention, there is provided a manufacturing device of a joined body in which a plurality of structures are joined to each other using an adhesive in a state of being stacked, the device including an adhesive layer forming unit which forms an adhesive layer on one face of a medium; a viscosity adjusting unit which adjusts viscosity of the adhesive layer formed by the adhesive layer forming unit; a transcribing unit which transcribes the adhesive layer of which viscosity is adjusted by the viscosity adjusting unit to the structure; and a surface roughness measuring unit which measures surface roughness of the adhesive layer on the medium, in which the surface roughness measuring unit is disposed before the transcribing unit in a manufacturing line.

According to the manufacturing device of the joined body, it is possible to suppress an occurrence of a bonding failure in the joined body in advance, by providing the surface roughness measuring unit which measures surface roughness of the adhesive layer on the medium before the transcribing unit which transcribes the adhesive layer to the structure, in a manufacturing line.

In the manufacturing device of the joined body, it is preferable that the surface roughness measuring unit include a measuring unit which measure the surface roughness of the adhesive layer formed on the medium in a non-contact manner, and a support member which supports the medium from a side of a face opposite to a face on which the adhesive layer is formed, when measuring the surface roughness of the adhesive layer.

According to the manufacturing device, it is possible to perform measuring of surface roughness of the adhesive layer in a non-contact manner with respect to the adhesive layer, and in a state in which a medium is supported by the support member from the face on the side opposite to the face on which the adhesive layer is formed, in a manufacturing line. In this manner, since measuring can be performed in a state in which a surface roughness measuring portion of the medium on which the adhesive layer is formed is set to be planar, and without giving damage to the adhesive layer, it is possible to measure surface roughness with good accuracy. Accordingly, it is possible to manufacture a joined body with high reliability, with a good manufacturing efficiency.

In the manufacturing device of the joined body, it is preferable that the measuring unit include an irradiation portion which radiates light and a light receiving portion which receives light, and the support member be provided with a through hole portion which is larger than a measuring spot necessary for measuring the surface roughness of the adhesive layer using the measuring unit, at a position corresponding to a position to which the light is radiated.

According to the manufacturing device, since it is possible to measure surface roughness of the adhesive layer in a non-contact manner, and the through hole portion larger than the measuring spot of the measuring unit is provided at the position of the support member which corresponds to the position to which light is radiated, it is possible to measure surface roughness with good accuracy without being influenced by a reflection of light, from the support member.

In the manufacturing device of the joined body, it is preferable that the support member be disposed at a position in which the medium is pressed toward the measuring unit by a predetermined amount, when measuring at least the surface roughness of the adhesive layer.

According to the configuration, since it is possible to make a surface roughness measuring portion of the medium on which the adhesive layer is formed planar, effectively, using the support member, measuring accuracy of surface roughness can be improved.

In the manufacturing device of the joined body, it is preferable that the support member have a curved face which curves toward the measuring unit.

According to the configuration, it is possible to perform a stable measurement by supporting the surface roughness measuring portion of the medium on which the adhesive layer is formed, using the support member, while suppressing bending of the medium using end portions of the support member.

In the manufacturing device of the joined body, it is preferable to include a support member moving mechanism which moves the support member to a position of supporting the medium by being in contact with the medium, and a position of being not in contact with the medium.

According to the configuration, it is possible to perform a stable measurement of surface roughness, while preventing the support member from giving damage such as deformation or a scratch to the medium in the middle of transporting by being in contact with the medium, by moving the support member to a position of being not in contact with the medium when transporting the medium, and to a position of supporting the medium only when measuring surface roughness using the support member moving mechanism.

In the manufacturing device of the joined body, it is preferable that the support member be at least a roller member which is rotatably provided in a transport direction of the medium.

According to the configuration, even when the support member is in contact with the medium in the middle of transporting, the roller member rotates, and the roller member as the support member does not give damage to the medium, it is possible to perform a stable measurement by supporting the medium when measuring surface roughness.

BRIEF DESCRIPTION OF THE DRAWINGS

The invention will be described with reference to the accompanying drawings, wherein like numbers reference like elements.

FIG. 8A is an enlarged schematic view of a portion VIIIA in FIG. 4 of a manufacturing device of a joined body according to a third embodiment.

FIG. 8B is an enlarged schematic view of a portion VIIIB in FIG. 4 of the manufacturing device of the joined body according to the third embodiment.

DESCRIPTION OF EXEMPLARY EMBODIMENTS

Hereinafter, an embodiment for executing the invention will be described with reference to accompanying drawings. In the embodiment which will be described below, various limitations are described as preferable specific examples; however, the scope of the invention is not limited to these forms as long as there is no description for limiting the invention in particular, in the following descriptions. In the following descriptions, an ink jet printer (hereinafter, referred to as printer) as a type of a liquid ejecting apparatus on which an ink jet recording head (hereinafter, referred to as recording head) as a type of a liquid ejecting head which is provided with a MEMS device including a joined body in the invention is mounted will be exemplified.

First, a configuration of a printer 1 will be described with reference to FIG. 1.

Figure 1:
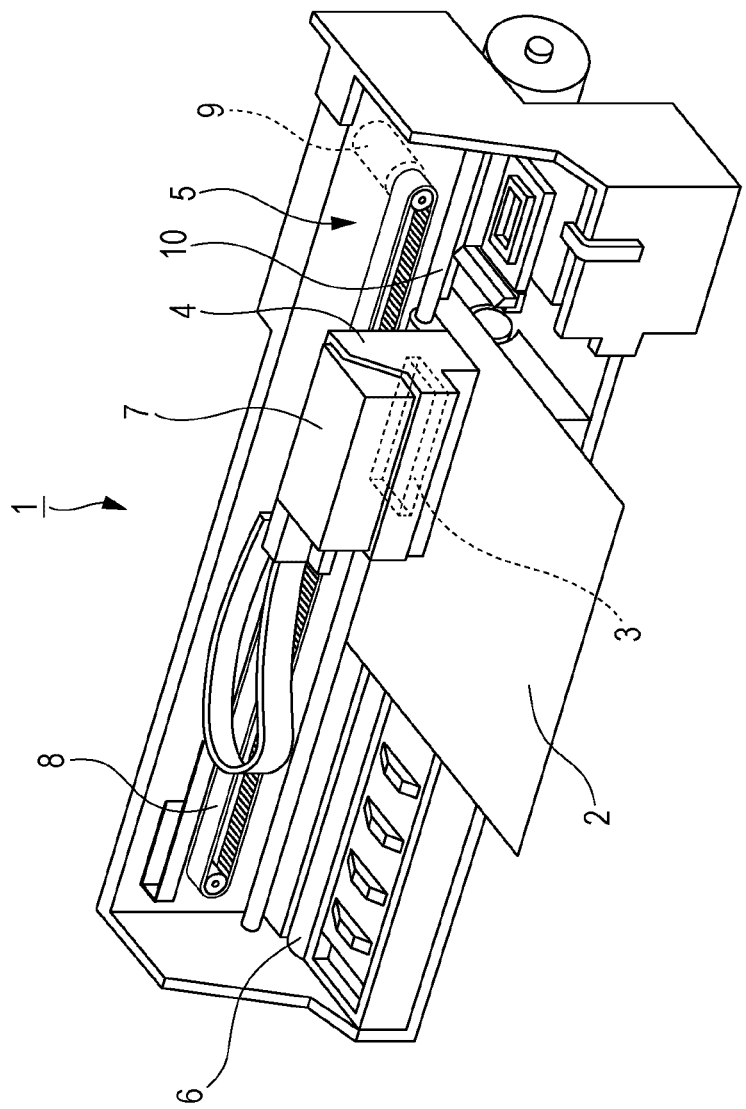
FIG. 1 is a perspective view which describes a configuration of a liquid ejecting apparatus (printer).

FIG. 1 is a perspective view of the printer 1. The printer 1 according to the embodiment is an apparatus which forms dots by ejecting ink to the surface of a recording medium 2 (a type of landing target of liquid) such as a recording sheet, and causing the ink to be landed, and performs recording of an image, or the like, when the dots are arranged. The printer 1 is provided with a recording head 3 for ejecting ink, a carriage 4 to which the recording head 3 is attached, a carriage moving mechanism 5 which moves the carriage 4 in the main scanning direction, a platen roller 6 which moves the recording medium 2 in the sub-scanning direction, and the like. Ink as a type of liquid is stored in an ink carriage 7 as a liquid supply source. The ink cartridges 7 is detachably mounted on the recording head 3. It is also possible to adopt a configuration in which the ink cartridges 7 is disposed on a main body side of the printer 1, and ink is supplied from the ink cartridges 7 to the recording head 3 through an ink supply tube.

The above described carriage moving mechanism 5 is provided with a timing belt 8. In addition, the timing belt 8 is driven by a pulse motor 9 such as a DC motor. Accordingly, when the pulse motor 9 is operated, the carriage 4 reciprocates in the main scanning direction (width direction of recording medium 2) by being guided by a guide rod 10 stretched over the printer 1. In addition, the printer 1 records an image, or the like, on the recording medium 2 by ejecting ink from a nozzle 27 of the recording head 3 to the recording medium 2, while causing the carriage 4 to reciprocate in the main scanning direction.

Figure 2:
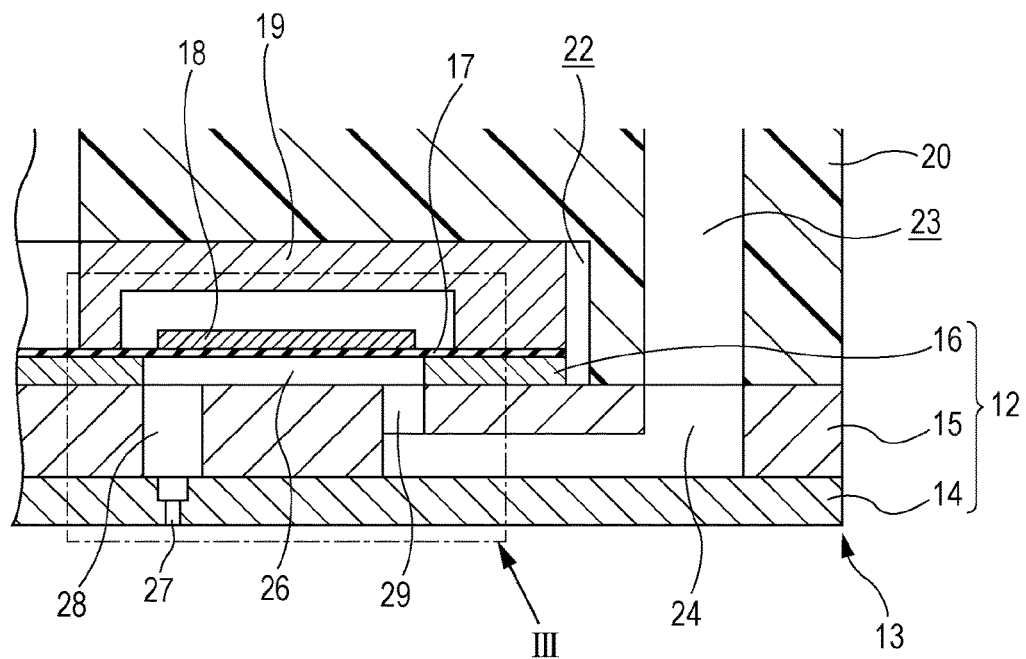
FIG. 2 is a sectional view which describes a configuration of a liquid ejecting head (recording head).
Figure 3:
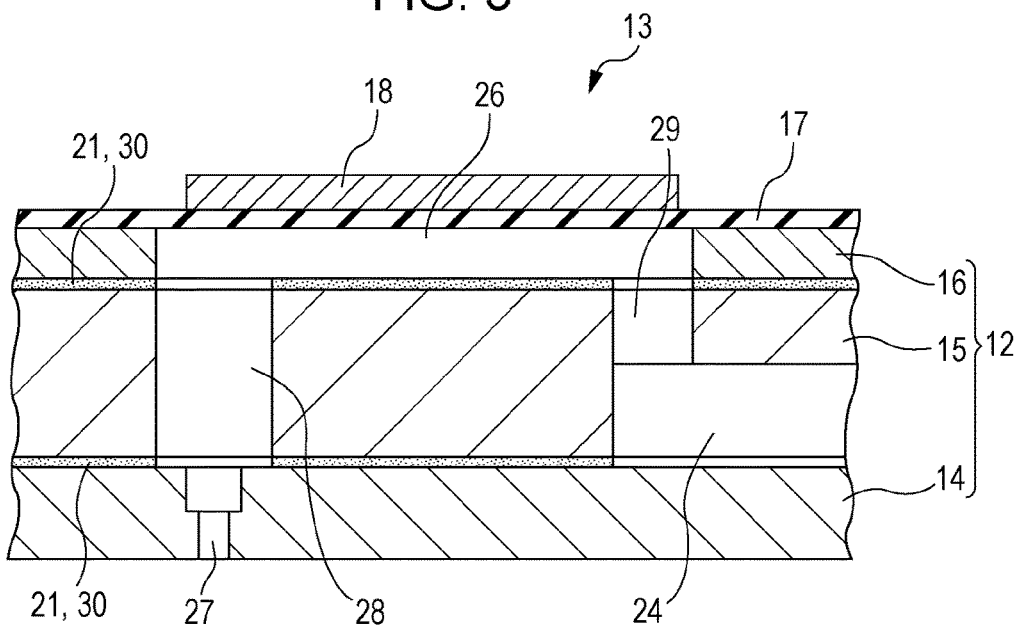
FIG. 3 is an enlarged view of a region III in FIG. 2.

FIG. 2 is a sectional view which illustrates an internal configuration of the recording head 3. FIG. 3 is an enlarged sectional view of a region III in FIG. 2. For convenience, a stacking direction of each member will be described as a vertical direction. In FIG. 3, a protective substrate 19 is not illustrated. The recording head 3 according to the embodiment includes a joined body 12 in which a plurality of substrates (corresponding to structure in invention), specifically, a nozzle plate 14, a communicating substrate 15, and a pressure chamber forming substrate 16 are stacked in this order, are joined to each other using an adhesive 21 (adhesive layer 30) which will be described later, and are set to a unit. An elastic film 17, a piezoelectric element 18 (a type of piezoelectric element or actuator), and the protective substrate 19 are stacked on a face on a side opposite to the communicating substrate 15 side of the pressure chamber forming substrate 16 in the joined body 2, and configure a MEMS device 13 in the invention. In addition, when the MEMS device 13 is attached to a case 20, the recording head 3 is configured.

The case 20 is a box-shaped member of a synthetic resin to which the MEMS device 13 is fixed on the base side thereof. An accommodating hollow portion 22 which is recessed in a parallelepiped shape from the lower face to halfway in a height direction of the case 20 is formed on the lower face side of the case 20, and when the MEMS device 13 is joined to the lower face, the pressure chamber forming substrate 16, the elastic film 17, the piezoelectric element 18, and the protective substrate 19 in the MEMS device 13 are accommodated in the accommodating hollow portion 22. In addition, an ink introducing path 23 is formed in the case 20. Ink from the above described ink cartridges 7 is introduced to the common liquid chamber 24 of the MEMS device 13 through the ink introducing path 23.

The pressure chamber forming substrate 16 in the embodiment is formed of a silicon single crystal substrate (hereinafter, simply referred to as silicon substrate). A plurality of pressure chamber hollow portions which partition a pressure chamber 26 are formed in the pressure chamber forming substrate 16, corresponding to each nozzle 27 of the nozzle plate 14 using anisotropic etching. In this manner, it is possible to secure high accuracy in a dimension or a shape by forming a micro space which is a flow path of a pressure chamber, or the like, using anisotropic etching with respect to the silicon substrate. An opening portion on one side (top face side) of the pressure chamber hollow portion in the pressure chamber forming substrate 16 is sealed with the elastic film 17. In addition, the communicating substrate 15 is joined to a face on a side opposite to the elastic film 17 in the pressure chamber forming substrate 16, and the other opening portion of the pressure chamber hollow portion is sealed with the communicating substrate 15. In this manner, the pressure chamber 26 is formed in a partitioning manner.

The pressure chamber 26 according to the embodiment is a hollow portion which is long in a direction (second direction) orthogonal to an aligning direction (first direction) of the nozzle 27. One end portion of the pressure chamber 26 in the second direction communicates with the nozzle 27 through a nozzle communicating port 28 of the communicating substrate 15. In addition, the other end portion of the pressure chamber 26 in the second direction communicates with the common liquid chamber 24 through an individual communicating port 29 of the communicating substrate 15. A plurality of the pressure chambers 26 are aligned along a nozzle column direction (first direction), corresponding to each nozzle 27. The communicating substrate 15 is a plate member formed of a silicon substrate, similarly to the pressure chamber forming substrate 16. A hollow portion as the common liquid chamber 24 (also referred to as reservoir or manifold) which is commonly provided in the plurality of pressure chamber 26 of the pressure chamber forming substrate 16 is formed in the communicating substrate 15 using anisotropic etching. The common liquid chamber 24 is a hollow portion which is long along the aligning direction (that is, first direction) of each of the pressure chambers 26. The common liquid chamber 24 and each of the pressure chambers 26 communicate through the individual communicating port 29.

The above described nozzle plate 14 is a plate member on which the plurality of nozzles 27 are open in a column shape. According to the embodiment, a nozzle column is configured when the plurality of nozzles 27 are provided in column at a pitch corresponding to a dot forming density. The nozzle plate 14 in the embodiment is formed of a silicon substrate, and the nozzle 27 in a cylindrical shape is formed by performing dry etching with respect to the substrate. In addition, an ink flow path (a type of liquid flow path) which goes from the above described common liquid chamber 24 to the nozzle 27 through the individual communicating port 29, the pressure chamber 26, and a nozzle communicating port 28 is formed in the MEMS device 13 according to the embodiment.

The elastic film 17 formed on a top face of the pressure chamber forming substrate 16 is configured of silicon dioxide of which a thickness is approximately 1 µm, for example. The piezoelectric elements 18 are respectively formed at positions corresponding to each of the pressure chambers 26 on the elastic film 17. The piezoelectric element 18 according to the embodiment is configured when a metallic lower electrode film, a piezoelectric layer formed of lead zirconate titanate (PZT), or the like, and a metallic higher electrode film (neither thereof is illustrated) are sequentially stacked. In the configuration, one of the higher electrode film and the lower electrode film is set to a common electrode, and the other is set to an individual electrode. An electrode film as the individual electrode and the piezoelectric layer are patterned in each pressure chamber 26. In the piezoelectric element 18, a region in which the piezoelectric layer is interposed between the higher electrode layer and the lower electrode layer is a piezoelectric active portion in which piezoelectric distortion is caused due to an application of a voltage to both of the electrodes. In addition, when the piezoelectric active portion is deformed in a flexural manner according to a change in applied voltage, a flexural face which partitions one face of the pressure chamber 26, that is, the elastic film 17 displaces toward a side close to the nozzle 27 or a direction far from the nozzle 27. In this manner, a pressure change occurs in ink in the pressure chamber 26, and the ink is ejected from the nozzle 27 using the pressure change.

As illustrated in FIG. 3, the nozzle plate 14, the communicating substrate 15, and the pressure chamber forming substrate 16 as the structure which configures the joined body 12 are joined to each other using the adhesive 21. The adhesive 21 is applied to a transcribing film 33 (a type of medium in invention) as an adhesive layer 30, as will be described later, and is transcribed to a joining face of a substrate (structure) thereafter. Like the MEMS device 13 according to the embodiment, in a configuration in which a movable region (active region) formed of a flexural face which partitions one face of the pressure chamber 26 and a movable region (active region) formed of the piezoelectric element 18 which displaces the flexural face are provided, and which includes a space communicating with the movable region, for example, the ink flow path such as the nozzle communicating port 28, the pressure chamber 26, the individual communicating port 29, and the common liquid chamber 24, there is a case in which bonding between substrates is not sufficient due to holding of air bubbles, and the like, when the thickness of the adhesive 21 is uneven, and as a result, there has been a risk in which separation or leakage of ink occurs at the portion in which bonding is not sufficient. In the following descriptions, a manufacturing method in which it is possible to suppress such a failure will be described.

First, an example of a configuration of a manufacturing device of the joined body 12 in the invention (also referred to as manufacturing device of MEMS device 13 or manufacturing device of recording head 3 in invention) will be described.

Figure 4:
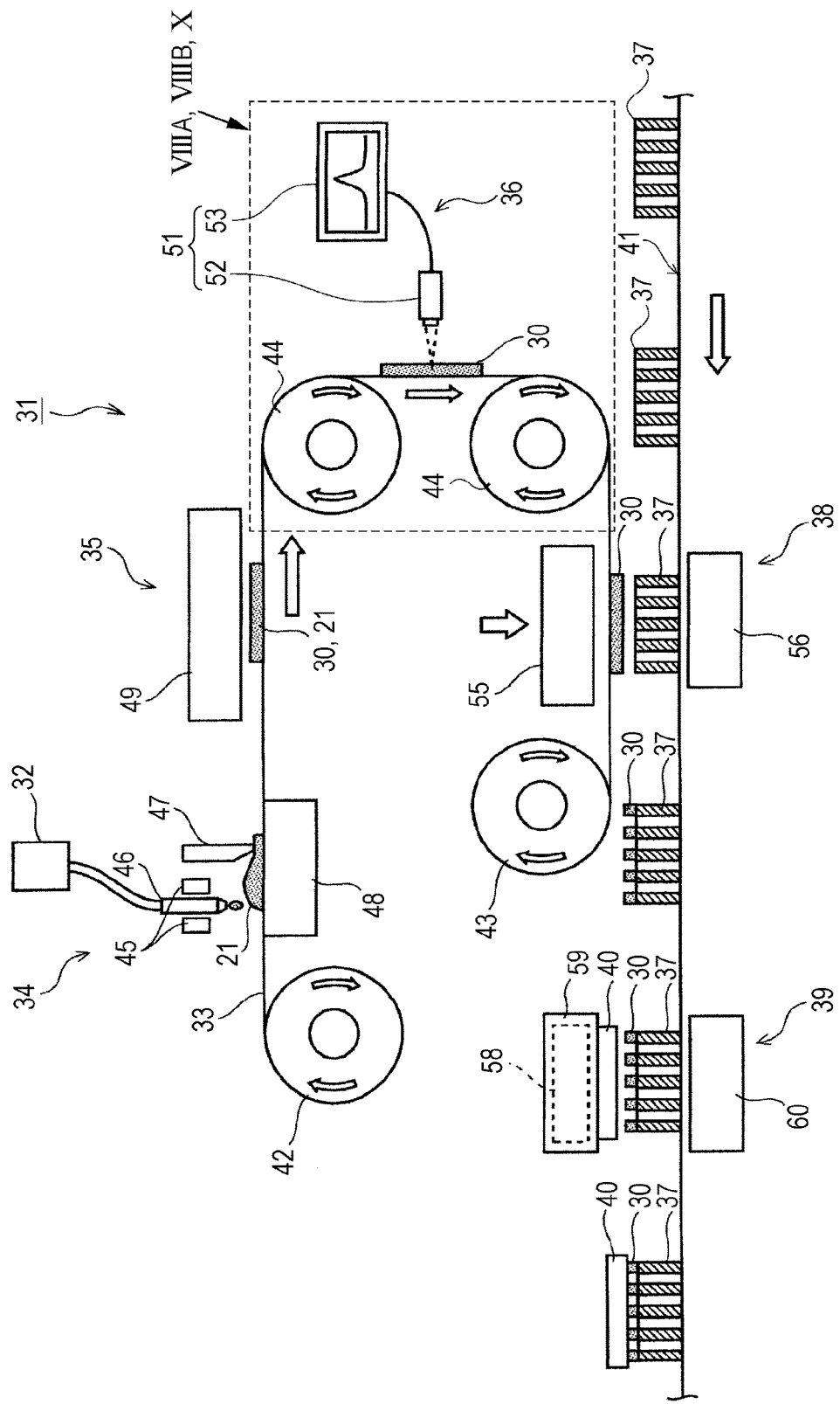
FIG. 4 is a schematic view which illustrates an example of a configuration of a manufacturing device of a joined body in the invention.

FIG. 4 is a schematic view which describes a configuration of a manufacturing device 31 of the joined body 12.

The manufacturing device 31 of the joined body 12 is provided with an adhesive accommodating unit 32 which receives the adhesive 21 as a joining material containing a thermosetting resin, an adhesive layer forming unit 34 which forms the adhesive layer 30 by applying the adhesive 21 to one face of the transcribing film 33 as a transcribing medium, a viscosity adjusting unit 35 which adjusts (increases) viscosity of the adhesive layer 30 by heating the adhesive layer 30 which is applied to the transcribing film 33, a surface roughness measuring unit 36 which measures surface roughness of the adhesive layer 30, a transcribing unit 38 which transcribes the adhesive layer 30 to a first member 37 (for example, communicating substrate 15) as a type of the structure which configures the joined body 12, a joint unit 39 which joins the first member 37 and a second member 40 (for example, pressure chamber forming substrate 16) using the adhesive 21 (adhesive layer 30), a transport unit 41 which transports the first member 37, a feeding roller 42 which sends the transcribing film 33, a winding roller 43 which winds up the transcribing film 33, an intermediate roller 44 which is disposed between the feeding roller 42 and the winding roller 43, and adjusts a tension or a transport direction of the transcribing film 33, and the like.

The adhesive layer forming unit 34 is provided with the adhesive accommodating unit 32 in which the adhesive 21 is accommodated, a first heating mechanism 45 which heats the adhesive 21 from the adhesive accommodating unit 32, a dispenser 46 which applies the adhesive 21 to the transcribing film 33 (a type of medium) which is in a liquid state by being heated by the first heating mechanism 45, a squeegee 47 which makes the adhesive 21 applied by the dispenser 46 planar on the transcribing film 33, and sets the adhesive to a film-shaped adhesive layer 30, and a support unit 48 which supports the transcribing film 33 from a face side opposite to a face on the side in which the squeegee 47 is provided, when performing planarization.

The first heating mechanism 45 is disposed so as to surround the periphery of the dispenser 46. The first heating mechanism 45 gives fluidity to the adhesive 21 by lowering viscosity of the adhesive by heating the adhesive 21, before the adhesive 21 is applied onto the transcribing film 33 from the dispenser 46. In this manner, it is possible to make the adhesive 21 be smoothly applied to the transcribing film 33 from the dispenser 46. The manufacturing device 31 is not necessarily provided with the first heating mechanism 45, and it is possible to adopt a configuration in which the adhesive 21 to which fluidity is given in advance is supplied to the manufacturing device 31. The squeegee 47 performs planarization with respect to the adhesive 21 which is applied to the transcribing film 33 using the dispenser 46, and sets the adhesive to the adhesive layer 30 with a predetermined film thickness. The support unit 48 supports the transcribing film 33 from a face side opposite to a face onto which the adhesive 21 is applied, when the adhesive 21 is subjected to planarization using the squeegee 47.

As the thermosetting resin which configures the adhesive 21 (adhesive layer 30) in the embodiment, there are silicone rubber, an addition-type silicone resin, a condensation-type silicone resin, an epoxy resin, an acrylic resin, and the like; however, it is preferable to use the addition-type silicone resin. Since it is possible to exert an operation of relieving stress caused between structures in the joined body 12 which is finally obtained, in this manner, separation rarely occurs, and as a result, it is possible to improve joining reliability. In addition, there is a slight chance of degassing and hardening shrinkage at a time of hardening reaction. In addition, it is possible to make water resistance, solvent resistance, ink resistance, and the like, of the joined body 12 which is formed by the adhesive 21 (adhesive layer 30) especially excellent, and it is possible to make a swelling ratio of the joined body 12 small. For this reason, it is possible to preferably apply the adhesive to manufacturing of the joined body 12 which is in contact with liquid (ink).

As the addition-type silicone resin, for example, there is a straight silicone resin such as a methyl-based silicone resin, a phenyl-based silicone resin, and a methylphenyl-based silicone resin, a denatured silicone resin such as an alkyd modified silicone resin, an epoxy modified silicone resin, an acrylic modified silicone resin, a polyester modified silicone resin, and the like; however, in particular, it is preferable to use one, or two or more types selected from a group formed of a methyl-based straight silicone resin, a phenyl-based silicone resin, and a denatured silicone resin, and it is more preferable to use a methyl-based straight silicone resin.

The adhesive 21 may contain a component other than the thermosetting resin (composition other than that). As such a component, there is a solvent, a hardening agent, a cross-linker, a catalyst, a polymerization initiator, a polymerization prohibition agent, a coloring agent, an antioxidant, a preservative, an antifungal agent, and the like, for example. As the catalyst, for example, it is possible to use a Pt catalyst, an Al complex, a Fe complex, a rhodium complex, or the like. By containing the polymerization prohibition agent, it is possible to effectively prevent an unwilling polymerization reaction of the thermosetting resin which configures the adhesive 21 from proceeding before the adhesive layer forming unit 34 (adhesive layer forming processing), and easily adjust a degree of cure (degree of polymerization).

The transcribing film 33 is sent to the manufacturing line using the feeding roller 42, and is wound up using the winding roller 43 by sequentially passing through the adhesive layer forming unit 34, the viscosity adjusting unit 35, the surface roughness measuring unit 36, and the transcribing unit 38. As a material for forming the transcribing film 33, for example, there is polyethylene terephthalate, a tetrafluoroethylene-perfluoroalkyl vinylether copolymer (PFA), tetrafluoroethylene-hexafluoropropylene copolymer (FEP), polychloro-trifluoroethylene (PCTFE), a cycloolefin polymer (COP), a tetrafluoroethylene-ethylene copolymer (ETFE), and the like, and it is preferable to use the polyethylene terephthalate among them. The polyethylene terephthalate is relatively cheap, has an appropriate flexibility, and is excellent in handling (easy to handle). In this manner, it is possible to make release characteristics of the adhesive 21 (adhesive layer 30) excellent, and smoothly perform transcribing of the adhesive 21 to the structure. It is preferable that a thickness of the transcribing film 33 be 10 µm or more and 2,000 µm or less. It is preferable that a film thickness of the adhesive 21 (adhesive layer 30) formed in the adhesive layer forming process be 1 µm or more and 3 µm or less. In this manner, it is possible to further effectively prevent jutting out, or the like, of the adhesive 21 from a joined portion in the joined body 12 which is finally obtained, and obtain desirable joining intensity of the joined body 12. In particular, since the joined body 12 according to the embodiment has an ink flow path in the inside, and jutting out of the adhesive 21 toward the flow path is suppressed, it is possible to suppress an adverse effect with respect to ejection of ink caused by an interference in displacement of a flexural portion due to attaching of the adhesive 21, constriction of the flow path due to the adhesive 21, or the like, for example.

The viscosity adjusting unit 35 causes a part of hardening reaction of the thermosetting resin to proceed (temporal hardening of thermosetting resin) by heating the adhesive 21 on the transcribing film 33, and raises viscosity of the adhesive layer 30. In this manner, a stability of a shape of the adhesive layer 30 is improved. As a result, it is possible to suppress unwilling deformation or jutting out of the adhesive layer 30 in the transcribing processing using the transcribing unit 38 in the rear stage. The viscosity adjusting unit 35 according to the embodiment is provided with a second heating mechanism 49 which heats the adhesive layer 30 on the transcribing film 33. The second heating mechanism 49 in the embodiment is provided on the outer surface side (face side opposite to face on the transfer film 33 side) of the adhesive layer 30 on the transcribing film 33, and heats the adhesive layer 30 from the face side. A providing portion of the second heating mechanism 49 is not particularly limited, and may be a face side opposite to the face on which the adhesive layer 30 of the transcribing film 33 is formed (rear surface side). In addition, a plurality of the second heating mechanisms 49 may be used, and for example, the second heating mechanisms 49 may be respectively disposed on both face sides of the transcribing film 33 to which the adhesive layer 30 is applied. A heating temperature (setting temperature) using the second heating mechanism 49 is set to 60° C. or more and 120° C. or less, for example, and a heating time is set to 2 minutes or more and 10 minutes or less, for example.

The surface roughness measuring unit 36 measures a film thickness of the adhesive layer 30 using a film thickness measuring unit 51, and measures surface roughness in a non-contact manner. The film thickness measuring unit 51 in the embodiment is configured of an optical unit 52 and a main body of the unit 53. The main body of the unit 53 is provided with a light source, a spectral unit, a control unit, a display unit, an input unit, and the like, which are not illustrated. The film thickness measuring unit 51 radiates light to the adhesive layer 30 on the transcribing film 33 from an irradiation unit which radiates light of the optical unit 52, receives reflected light from the adhesive layer 30 in a light receiving unit which receives the light of the optical unit 52, and detects intensity in each wavelength of the reflected light. That is, the film thickness measuring unit 51 disperses the reflected light input through the optical unit 52 from the adhesive layer 30 side for each wavelength, and detects an intensity of received light which is dispersed, for each wavelength. In addition, the film thickness measuring unit 51 indirectly obtains a film thickness and surface roughness of the adhesive layer 30 based on light receiving intensity of the detected light.

More specifically, when incoherent light such as white light from the optical unit 52 is radiated toward the adhesive layer 30, reflected light on the surface of the adhesive layer 30 and light reflected on an interface between a face on one side of the transcribing film 33 on the backside of the adhesive layer 30 and the adhesive layer 30 interfere with each other due to a difference in optical path length. A wavelength of spectral spectrum (hereinafter, referred to as reflection spectrum) of reflected light after the interference becomes small when a film thickness of the adhesive layer 30 is large. In addition, the film thickness measuring unit 51 obtains a film thickness based on peak intensity (intensity of peak frequency) of reflection spectrum, for example. The peak intensity of the reflection spectrum is changed according to surface roughness of the adhesive layer 30. That is, the rougher the surface of the adhesive layer 30, the lower the peak intensity of the reflection spectrum. For this reason, it is possible to grasp surface roughness of the adhesive layer 30 based on light receiving intensity of the film thickness measuring unit 51 by obtaining a relationship between desirable surface roughness of the adhesive layer 30 and peak intensity of the reflection spectrum in advance. The surface roughness of the adhesive layer 30 appears due to unevenness of a film thickness of the adhesive layer 30. Since the film thickness of the adhesive layer 30 in the embodiment is adjusted to 1 μm or more and 3 μm or less, the rougher the surface, the lower the adhesive property. In addition, since a configuration of such a film thickness measuring unit is well known, detailed descriptions will be omitted. In addition, it is possible to adopt various well-known methods without being limited to the exemplified method of obtaining the film thickness. For example, it is possible to similarly measure surface roughness when it is a film thickness measuring unit which uses an interference of an electromagnetic wave. In short, the film thickness measuring unit may be a film thickness measuring unit of a type in which a film thickness is obtained in a non-contact manner with respect to the adhesive layer 30.

Figures 5, 6:
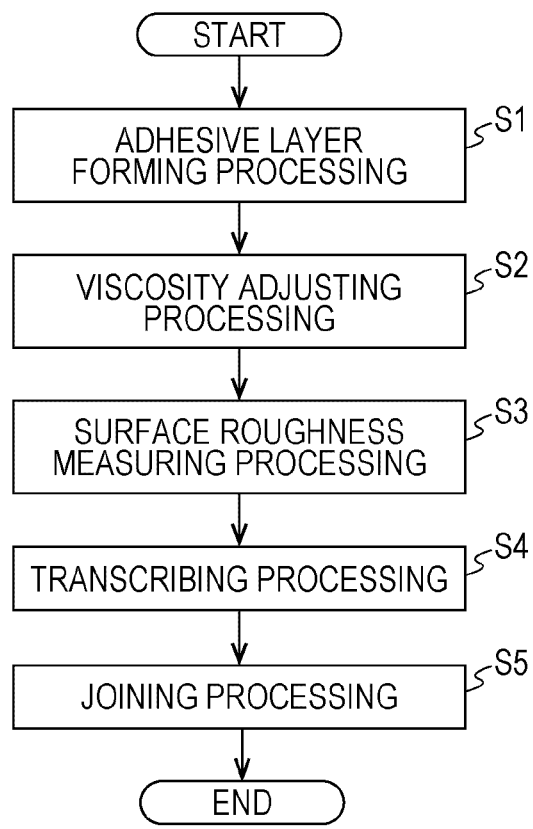
FIG. 5 is a table which denotes a relationship between intensity of a peak frequency of a reflection spectrum when measuring a film thickness of an adhesive layer in a film thickness measuring unit and joining intensity in the joined body.
FIG. 6 is a flowchart which describes a manufacturing process of the joined body.

FIG. 5 is a table in which a relationship between peak intensity of reflection spectrum and joining intensity of the adhesive layer 30 (adhesive 21) in the joined body 12 is described. The mark "X" in the table denotes that the adhesive layer is disqualified, since bonding intensity when joining structures of the joined body 12 using the adhesive layer 30 is not sufficient, and there is a concern of separation or leakage of ink in the joined portion. The adhesive layer 30 determined to be disqualified is not used (is not transcribed in first member 37) when joining the structures of the joined bodies 12. In addition, the mark "O" denotes that the adhesive layer is qualified, since desirable bonding intensity is obtained when joining the structures of the joined body 12 using the adhesive layer 30, and there is almost no concern of separation or leakage of ink in the joined portion. The qualified adhesive layer 30 is used (is transcribed to first member 37) when joining the structures of the joined body 12.

In this manner, the peak intensity of the reflection spectrum detected in the above described film thickness measuring unit 51 and surface roughness on the surface of the adhesive layer 30 are related to each other, and when intensity of the peak frequency is above a certain degree, it is possible to obtain an adhesive layer 30 with a film thickness which is relatively stable. For example, as illustrated in FIG. 5, in a case in which peak intensity is 1.0 or less, the adhesive layer 30 is determined to be disqualified (X) when considering a relation between the peak intensity of the reflection spectrum and the joining intensity when measuring the film thickness of the adhesive layer 30 in the film thickness measuring unit 51, since it is not possible to sufficiently obtain bonding intensity using the adhesive layer 30 in the joined body 12 after joining, and there is a concern of separation in a joined portion or leakage of ink in the joined portion. In contrast to this, in a case in which peak intensity is 15 or more, the adhesive layer is determined to be qualified (O), since the film thickness of the adhesive layer 30 becomes regular, and bonding intensity using the adhesive layer 30 in the joined body 12 after joining becomes desirable. That is, according to the adhesive layer 30 which is determined to be qualified, it is possible to suppress separation of structures, leakage of ink, or the like, due to holding of air bubbles, or the like, of the adhesive layer 30 in the joined body 12. In this manner, it is possible to perform a pass-fail determination so that it is possible to obtain a desirable quality in the adhesive layer 30 based on a relationship, by obtaining the relationship between a detected value (light receiving intensity) using the film thickness measuring unit 51 and surface roughness on the surface of the adhesive layer 30 in advance.

The transcribing unit 38 in the embodiment is provided with a pressing mechanism 55 which presses the transcribing film 33 in a direction in which the adhesive layer 30 sent by being determined to be qualified in the surface roughness measuring unit 36 and the first member 37 which is sent to the transcribing unit 38 by the transport unit 41 come into contact with each other, and a support unit 56 which supports the first member 37 from a face side opposite to a face on a side in which the pressing mechanism 55 is provided when transcribing the adhesive layer 30 to the first member 37. Since viscosity of the adhesive layer 30 transcribed to the first member 37 in the transcribing unit 38 is increased through the viscosity adjusting processing, and the adhesive layer is determined to be qualified in the surface roughness measuring processing, a film thickness thereof becomes stable. Accordingly, adhesion between the first member 37 and the adhesive layer 30 improves in a state after transcribing of the adhesive layer 30, and it is possible to effectively prevent an occurrence of an unwilling gap (holding of air bubble) between the first member 37 and the adhesive layer 30. As a result, a reliability of joining between the first member 37 and the second member 40 in the joined body 12 improves, and it is possible to further increase durability and reliability of the entire joined body 12.

The joint unit 39 in the embodiment is provided with a third heating mechanism 58 which heats the adhesive layer 30 between the first member 37 and the second member 40, a pressing mechanism 59 which presses the second member 40 in a direction in which the adhesive layer 30 transcribed onto the first member 37 and the second member 40 are in contact with each other, and a support unit 60 which supports the first member 37 in a pressed state using the pressing mechanism 59. When heating is performed by the third heating mechanism 58 in the state in which the first member 37 and the second member 40 are pressed by the pressing mechanism 59, and the adhesive layer 30 is interposed therebetween, hardening of the thermosetting resin which configures the adhesive layer 30 further proceeds (main hardening), and due to this, the first member 37 and the second member 40 are joined by the adhesive layer 30 (adhesive 21). The third heating mechanism 58 in the embodiment is configured so as to be integrally provided with the pressing mechanism 59, and performs heating from the second member 40 side; however, it is not limited to this, and the third heating mechanism may be provided independently from the pressing mechanism 59, for example, or may be provided on the side in which the support unit 60 is provided, for example.

FIG. 6 is a flowchart which describes manufacturing processing (manufacturing method) of the joined body 12 using the above described manufacturing device 31. When a space, or the like, as an ink flow path is formed in each substrate (structure) which configures the joined body 12 in the embodiment using anisotropic etching, or the like, each of the substrates is joined by the adhesive 21 (adhesive layer 30), thereafter. In the following descriptions, particularly, processing of joining the communicating substrate 15 as the first member 37 and the pressure chamber forming substrate 16 as the second member 40 will be described. First, the adhesive layer 30 is formed when the adhesive 21 with a predetermined thickness is applied to one face of the transcribing film 33 using the adhesive layer forming unit 34 (adhesive layer forming processing S1). Subsequently, the adhesive layer 30 formed on the transcribing film 33 is subjected to heating processing, using the viscosity adjusting unit 35, is hardened so as not to be completely hardened, and viscosity of the adhesive layer increases (viscosity adjusting processing S2). Since the adhesive layer 30 (adhesive 21) in the embodiment is an addition-type resin, viscosity of hydrosilane and vinyl group is increased due to hydrosilylation in the heating processing. By increasing viscosity of the adhesive layer 30 to some extent in the viscosity adjusting processing, it is possible to suppress flowing out of the adhesive 21 in the transcribing processing thereafter.

Subsequently, in the surface roughness measuring unit 36, a film thickness and surface roughness of the adhesive layer 30 are measured based on light receiving intensity when radiating light to the adhesive layer 30 on the transcribing film 33, using the film thickness measuring unit 51 (surface roughness measuring processing S3). In addition, as described above, a pass-fail determination of the adhesive layer 30 is performed based on surface roughness. That is, the adhesive layer is determined to be qualified in a case in which light receiving intensity of reflected light (peak intensity of reflection spectrum) is larger than a predetermined value which is set in advance, and is determined to disqualified in a case of the predetermined value or less. In addition, the adhesive layer may be determined to be qualified in a case of the predetermined value or more, and may be determined to be disqualified in a case of a value less than the predetermined value. When describing a criterion of the above described pass-fail determination in other ways, it is possible to set so that the adhesive layer 30 is determined to be qualified when "surface roughness" is smaller than a predetermined value, and is determined to be disqualified when the surface roughness is a predetermined value or more.

Since measuring of the surface roughness is performed with respect to the adhesive layer 30 in a non-contact manner in a manufacturing line, it is possible to stably measure the surface roughness with good accuracy without giving damage to the adhesive layer 30 by adopting a configuration in which the surface roughness of the adhesive layer 30 is measured based on light receiving intensity when radiating light to the adhesive layer 30. For this reason, joining reliability of the joined body 12 is improved. Moreover, for example, it is not necessary to measure surface roughness using a contact-type measuring device, or the like, separately from the manufacturing line, by cutting out the transcribing film 33 on which the adhesive layer 30 is formed, and manufacturing efficiency improved. In addition, since surface roughness is measured after viscosity of the adhesive layer 30 is adjusted, in a case in which there is a change in surface roughness of the adhesive layer 30 after adjusting viscosity (heating), it is possible to grasp surface roughness of the adhesive layer 30 after the change. Due to this, final joining reliability of the joined body 12 further improves. In addition, manufacturing efficiency further improves, by measuring surface roughness and a film thickness of the adhesive layer 30 in the same processing. By grasping the thickness of the adhesive layer 30, it is possible to reduce jutting out of the adhesive 21 from the joining portion in the joined body 12. Since jutting out of the adhesive 21 on the ink flow path side is suppressed in the recording head 3 according to the embodiment, it is possible to reduce an adverse effect on an ejecting property.

Subsequently, the adhesive layer 30 which is determined to be qualified in the surface roughness measuring processing, and is sent from the surface roughness measuring unit 36 is transcribed to a joint face of the first member 37 which is sent to the transcribing unit 38 using the transport unit 41 (transcribing processing S4). Thereafter, the transcribing film 33 is separated from the adhesive layer 30. In this manner, the adhesive layer 30 is transcribed to a portion other than the opening of the ink flow path with a regular thickness on the joint face of the first member 37.

When the adhesive layer 30 is transcribed to the joint face of the first member 37, subsequently, the second member 40 as a joining partner is bonded to the face onto which the adhesive layer 30 is transcribed (joining processing S5). That is, the pressure chamber forming substrate 16 as the second member 40 which is the joining partner is joined to the face onto which the adhesive layer 30 of the communicating substrate 15 as the first member 37 is transcribed. In addition, the adhesive layer 30 is subjected to main hardening when heating is performed by the third heating mechanism 58 in a state in which the first member 37 and the second member 40 are pressed by the pressing mechanism 59 in a state in which the adhesive layer 30 is interposed therebetween, and in this manner, the first member 37 and the second member 40 are joined, using the adhesive layer 30 (adhesive 21).

The nozzle plate 14 is joined to a face on the side opposite to the pressure chamber forming substrate 16 of the communicating substrate 15 similarly to the flow which is described above. In this case, for example, the adhesive layer 30 is transcribed to the joint face with the nozzle plate 14 of the communicating substrate 15, and both of the substrates are joined. In this manner, the joined body 12 is set to a unit, and the ink flow path from the common liquid chamber 24 to the nozzle 27 through the individual communicating port 29, the pressure chamber 26, and the nozzle communicating port 28 is formed inside the joined body 12.

As described above, according to the manufacturing method of the joined body in the invention, it is possible to grasp application unevenness of the adhesive layer 30 before transcribing, by measuring surface roughness of the adhesive layer 30 on the transcribing film 33 in a stage before the transcribing processing. In this manner, it is possible to suppress an occurrence of a bonding failure in the joined body 12 which is formed by joining structures using the adhesive layer 30 (adhesive 21) in advance. For this reason, it is possible to improve yield, improve a reliability of the joined body 12, and reliabilities of the MEMS device 13 and the recording head 3 which have the joined body 12, as well. In addition, since it is possible to suppress an occurrence of unevenness in a film thickness of the adhesive layer 30 in the MEMS device 13 and the recording head 3 which have the joined body 12, it is possible to reduce a risk of leakage of ink, or a risk of separation from a portion in which bonding is not sufficient.

Meanwhile, the invention is not limited to the above described embodiment, and it is possible to perform various modifications based on claims.

Figure 7:
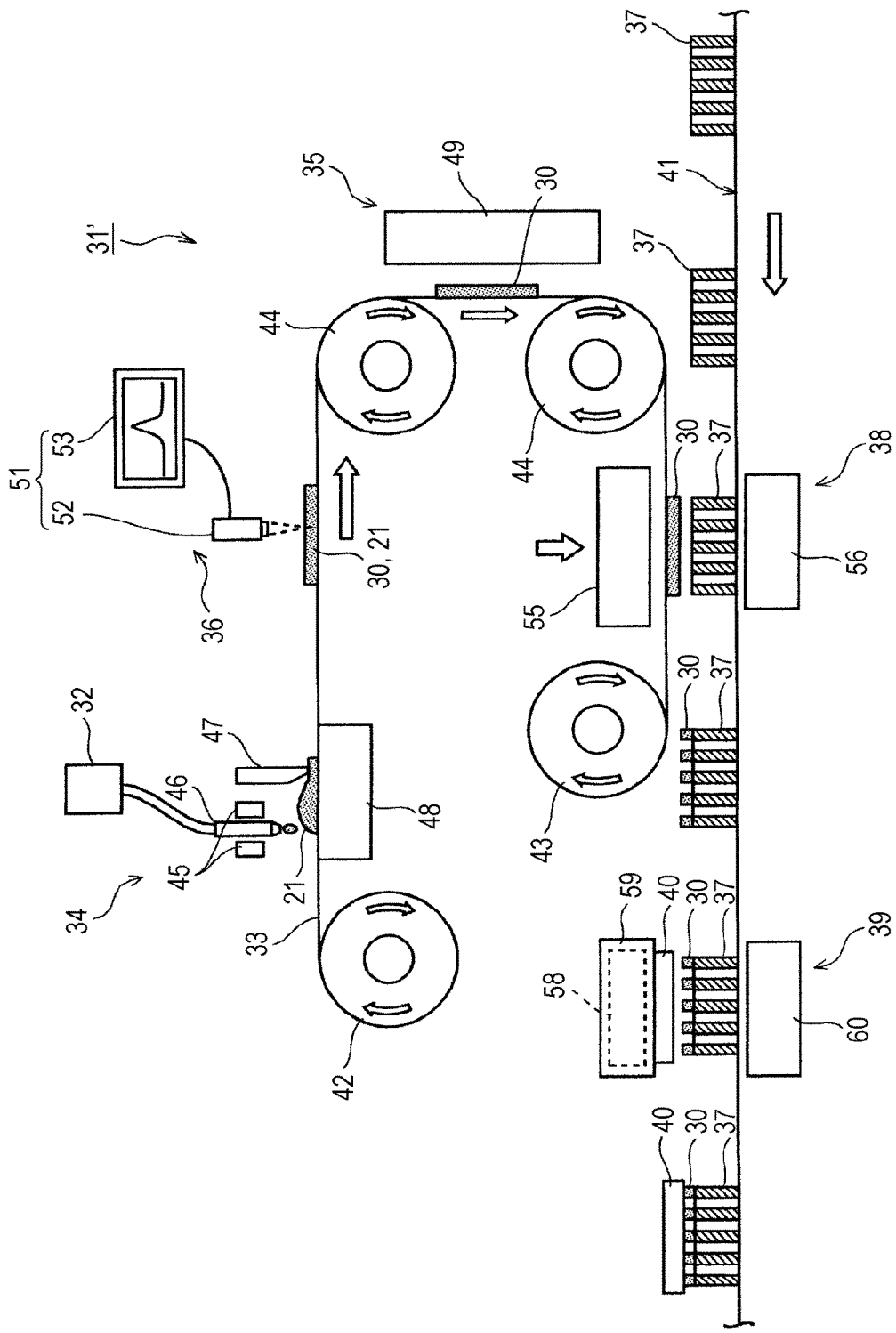
FIG. 7 is a schematic view which illustrates a configuration of a manufacturing device of a joined body according to a second embodiment.

FIG. 7 is a schematic view which describes a configuration of a manufacturing device 31' of a joined body 12 in a second embodiment. In the above described first embodiment, the example in which the surface roughness measuring processing is performed between the viscosity adjusting processing and the transcribing processing has been described; however, it is not limited to this, and the surface roughness measuring processing may be performed between the adhesive layer forming processing and the viscosity adjusting processing. That is, in the manufacturing device 31' illustrated in FIG. 7, a surface roughness measuring unit 36 is disposed between an adhesive layer forming unit 34 and a viscosity adjusting unit 35. In this manner, it is possible to grasp application unevenness when forming the adhesive layer 30 by measuring surface roughness before viscosity of the adhesive layer 30 is adjusted. In addition, in a case in which there is a possibility of an occurrence of a bonding failure, it is easy to perform an improvement of unevenness of the adhesive layer 30 (for example, addition of adhesive 21 using dispenser 46 and releveling using squeezer 47). As a result, it is possible to further improve yield. Since other configurations are the same as those in the above described first embodiment, detailed descriptions thereof will be omitted.

In the above descriptions, the joined body 12 which configures the MEMS device 13 used in the recording head 3 has been exemplified as the joined body related to the invention; however, it is not limited to this, and it is possible to apply the invention when it is a joined body in which a plurality of structures are joined by an adhesive, and the adhesive is transcribed to the structure. For example, it is also possible to apply the invention to a joined body which configures a sensor, or the like, which detects a pressure change, vibration, a displacement, or the like, of a movable region as a passive region.

In the above described embodiment, the recording head 3 as the liquid ejecting head has been exemplified; however, it is also possible to apply the invention to another liquid ejecting head in which a configuration in which a space such as a liquid flow path is partitioned, by joining a plurality of substrates which is a structure using an adhesive. For example, it is also possible to apply the invention to a coloring material ejecting head which is used when manufacturing a color filter of a liquid ejecting apparatus, and the like, an electrode material ejecting head which is used when forming an electrode of an organic electroluminescence (EL) display, a surface emission display (FED), and the like, a bioorganic material ejecting head which is used when manufacturing a biochip (biochemical element), and the like. In the coloring material ejecting head for the display manufacturing device, a solution of each coloring material of R (red), G (green), and B (blue) is ejected as a type of liquid. In addition, a liquid electrode material is ejected from the electrode material ejecting head for the electrode forming device as a type of liquid, and a solution of a bioorganic material is ejected from the organic material ejecting head for a chip manufacturing device as a type of liquid.

Figure 9:
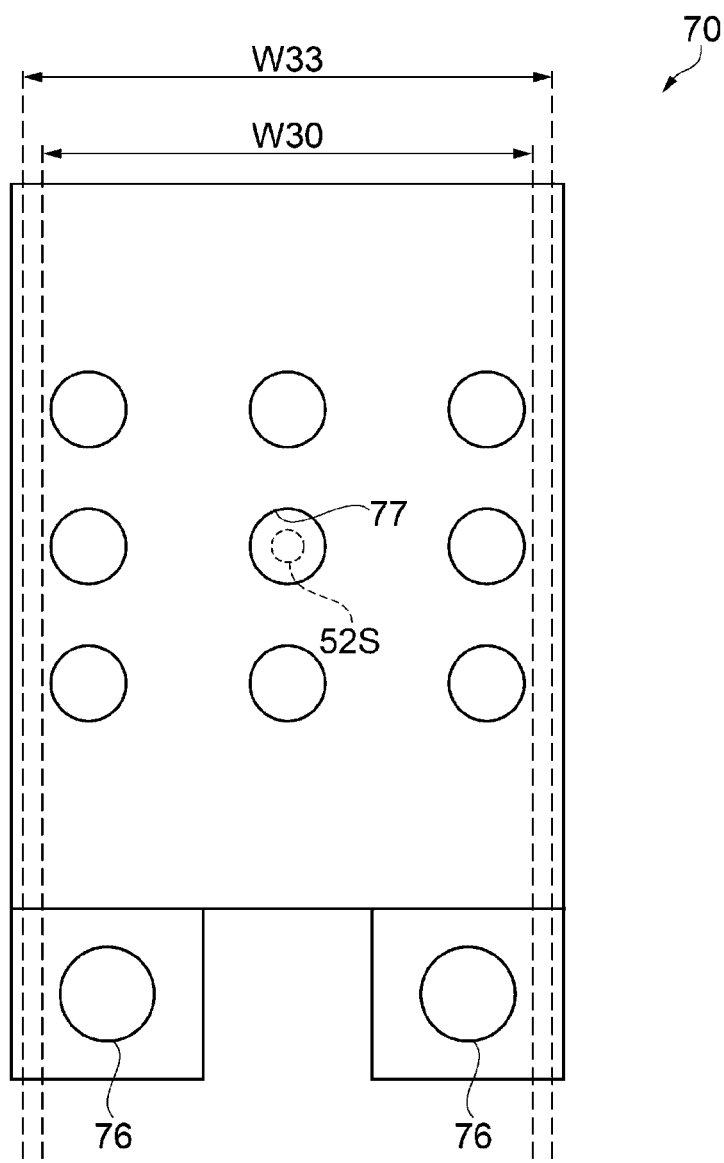
FIG. 9 is a schematic plan view which illustrates a support member of the manufacturing device according to the third embodiment.

FIGS. 8A and 8B are enlarged schematic views of a portion VIII in FIG. 4 of a manufacturing device 31A of a joined body related to a third embodiment, FIG. 8A illustrates a state in which measuring of surface roughness (measuring of film thickness) is not performed, and FIG. 8B illustrates a state in which measuring of surface roughness (measuring of film thickness) is performed. In addition, FIG. 9 is a schematic plan view which illustrates a support member 70 of the manufacturing device 31A in the third embodiment. Hereinafter, a configuration of the manufacturing device 31A related to the third embodiment will be described with reference to these drawings. In addition, portions with the same configuration as those in the above described embodiment will be given the same reference numerals, and redundant descriptions will be omitted.

As illustrated in FIG. 8A, a surface roughness measuring unit 36 of the manufacturing device 31A related to the embodiment is provided with a film thickness measuring unit 51 which has the same configuration as that in the above described embodiment, and measures a thickness of an adhesive layer 30 in a non-contact manner, and a support member 70 which supports a transcribing film 33 as a medium from a face side opposite to a face on which the adhesive layer 30 is formed, in the surface roughness measuring unit 36. In addition, the surface roughness measuring unit 36 is provided with a support member moving mechanism 75 which moves the support member 70 to a position in which the support member is supported by being caused to be in contact with the transcribing film 33, and a position of being not in contact with the transcribing film. The support member moving mechanism 75 in the embodiment includes a shaft portion 76 which is connected to the support member 70, and can move the support member 70 to a position in which the support member is supported by being caused to be in contact with the transcribing film 33, and a position of being not in contact with the transcribing film, by causing the shaft portion 76 to be operated in a sliding manner using a servo motor, for example. FIG. 8A illustrates a state in which the support member 70 is not in contact with the transcribing film 33, that is, a state in which a measurement of surface roughness (measurement of film thickness) is not performed, and FIG. 8B illustrates a state in which the support member 70 is supported by being in contact with the transcribing film 33, that is, a state in which a measurement of surface roughness (measuring of film thickness) is performed. It is possible to prevent a damage such as deformation or a scratch of the transcribing film 33 which can occur in a case in which the support member 70 is in contact with the transcribing film 33 in the middle of transporting, by transporting the transcribing film 33, when the support member 70 is located at a position of being not in contact with the transcribing film 33, as illustrated in FIG. 8A.

According to the manufacturing device 31A in the embodiment, in a manufacturing line, it is possible to perform measuring of surface roughness using a measurement of a thickness of the adhesive layer 30 in a non-contact manner with respect to the adhesive layer 30, and in a state in which the transcribing film 33 is supported by the support member 70 from a face on the side opposite to the face on which the adhesive layer 30 is formed. In this manner, it is possible to measure surface roughness with good accuracy, since it is possible to measure the surface roughness without giving a damage to the adhesive layer 30, and in a state in which the film thickness measuring portion in which the adhesive layer 30 of the transcribing film 33 is formed is set to be planar, by relieving a warp, bending, or the like, thereof. Accordingly, it is possible to manufacture a joined body 12 with a high reliability with good manufacturing efficiency.

According to the embodiment, as illustrated in FIG. 8B, the support member 70 is disposed at a position in which the transcribing film 33 on which the adhesive layer 30 is formed is pushed toward the film thickness measuring unit 51 by a predetermined amount using the support member moving mechanism 75, in s state in which surface roughness is measured (measurement of film thickness). In this manner, it is possible to further improve measuring accuracy of the surface roughness, since a warp or bending of the film thickness measuring portion of the transcribing film 33 on which the adhesive layer 30 is formed can be set to be planar using the support member 70.

As illustrated in FIG. 9, the support member 70 in the embodiment is provided with a through hole portion 77 which is larger than a measuring spot 52S which is necessary for measuring the thickness of the adhesive layer 30 using a film thickness measuring device 51 at a position corresponding to a position to which light is radiated from the film thickness measuring device 51 at a time of measuring surface roughness (measurement of film thickness). In the support member 70 in the embodiment, the through hole portions 77 provided at three portions of a center in a range of a width W33 of the transcribing film 33, and in a range of a width W30 of the adhesive layer 30 when supporting the transcribing film 33, and of both end portions interposing the above described portion therebetween are arranged in three columns in a longitudinal direction of the transcribing film 33 (direction intersecting direction of width W33 of the transcribing film 33).

According to the support member 70 with such a configuration, since the through hole portion 77 larger than the measuring spot 52S of the film thickness measuring device 51 is provided at a position corresponding to the position to which light of the support member 70 is radiated when measuring surface roughness of the adhesive layer 30 (measurement of film thickness) formed on the transcribing film 33, and reflected light from the adhesive layer 30 received by the optical unit 52 is rarely influenced by reflecting of light from the support member 70, it is possible to measure surface roughness (measurement of film thickness) with good accuracy.

In addition, it is possible to avoid an adverse effect on measuring of surface roughness (measurement of film thickness) when foreign substances are present on a supporting face of the transcribing film 33 of the support member 70.

The invention is not limited to the above described embodiment, and it is possible to add various modifications, improvements, or the like, to the above described embodiment. Modification examples will be described below.

Figure 10:
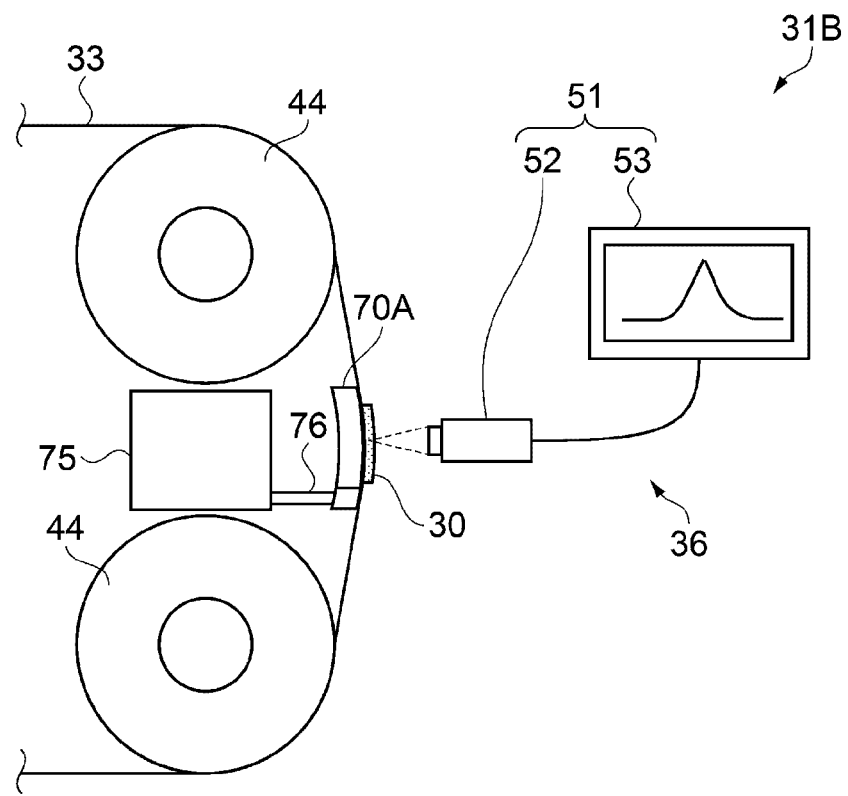
FIG. 10 is a partial schematic view corresponding to a portion X in FIG. 4 which illustrates a configuration of a manufacturing device of a joined body in modification example 1.

FIG. 10 is a partial schematic view corresponding to a portion X in FIG. 4 which illustrates a configuration of a manufacturing device 31B of a joined body in modification example 1.

In the manufacturing device 31B of a joined body 12 illustrated in FIG. 10, a support member 70A has a curved face which curves toward the film thickness measuring device 51. In addition, since configurations other than that are the same as those in the above described embodiment, detailed descriptions thereof will be omitted.

According to the configuration, since a film thickness measuring portion of the transcribing film 33 on which the adhesive layer 30 is formed is firmly supported by the curved face which curves so as to protrude toward the film thickness measuring device 51 side of the support member 70A, while suppressing deformation such as bending, or the like of the transcribing film 33 as a medium, using an end portion of the support member 70A, it is possible to stably measure surface roughness (measurement of film thickness).

As modification example 2 of a manufacturing device of a joined body, a configuration in which a support member is a roller member which is rotatably provided in a transport direction of the transcribing film 33 as at least a medium may be adopted. According to the configuration, even when the support member comes in contact with the transcribing film 33 in the middle of transporting the transcribing film 33, it is possible to suppress rubbing between the transcribing film 33 in the middle of transporting and the roller member as the support member, due to a rotation of the roller member as the support member along with a transport of the transcribing film 33, it is possible to provide a manufacturing device which performs manufacturing of the joined body 12 at all times including a time for transporting and a time for measuring surface roughness, while supporting the transcribing film 33 using the roller member as the support member. Accordingly, it is possible to manufacture the joined body 12 with high reliability, with high manufacturing efficiency by performing a stable film thickness measurement using the roller member as the support member at a time of measuring surface roughness, without giving damage such as deformation or a scratch of the transcribing film 33 in the middle of transporting.

Hitherto, manufacturing methods of the joined body, the MEMS device, the liquid ejecting head, and a manufacturing device of the joined body in the invention have been described based on embodiments which are illustrated; however, the invention is not limited to these. For example, a configuration of each unit in the invention can be replaced by a unit with an arbitrary configuration having the same function as that in the above described embodiments, and another arbitrary configuration can also be added.

In addition, the invention may be a combination of arbitrary two or more configurations (characteristics) in the above described plurality of embodiments.

In the above described third embodiment, the manufacturing device 31A in which the support member 70 is disposed in the surface roughness measuring unit 36 in the configuration of the manufacturing device 31 of the joined body 12 in the first embodiment has been described. However, it is not limited to this, and it may be a configuration in which the support member 70 is disposed in the surface roughness measuring unit 36 (refer to FIG. 7) in the configuration of the manufacturing device 31' according to the second embodiment.

In the manufacturing device 31A according to the third embodiment, the configuration in which the support member moving mechanism 75 which moves the support member 70 to a position of supporting by being in contact with the transcribing film 33 and a position of not being in contact with the transcribing film 33 is provided. However, it is not limited to this, and for example, it may be set to a state in which the transcribing film 33 as the medium is usually supported (in contact) by the support member 70 including a transporting time, without the support member moving mechanism 75, by taking a measure in which there is no influence of damage such as a scratch, even when the support member 70 comes in contact with the transcribing film 33 in the middle of transporting, by performing a surface treatment which makes slippery, or the like, on the supporting face of the transcribing film 33 of the support member 70, or a contact portion with another transcribing film 33.

In the support member 70 according to the above described third embodiment, the example in which nine through hole portions 77 in a circular shape are provided in a matrix has been described; however, it is not limited to this. The opening shape of the through hole portion 77 is not limited to the circular shape, and may be an oval shape or a long hole shape, for example, when it is possible to support the transcribing film 33 as the medium, and the through hole portion is larger than the measuring spot 52S. In addition, when it is possible to make sure of an accuracy of a measured value in the film thickness measurement, the number of through hole portions 77 may be smaller than nine, and in the reverse case, more than nine through hole portions 77 may be disposed.

The entire disclosure of Japanese Patent Application No. 2016-161045, filed Aug. 19, 2016 and 2016-246277, filed Dec. 20, 2016 are expressly incorporated by reference herein.

What is claimed is:

1. A manufacturing method of a joined body in which a plurality of structures are joined to each other using an adhesive in a state of being stacked, the method comprising:
    forming an adhesive layer on one face of a medium;
    adjusting viscosity of the adhesive layer formed in the forming of the adhesive layer;
    transcribing the adhesive layer of which viscosity is adjusted in the adjusting of viscosity to the structure; and
    measuring surface roughness of the adhesive layer on the medium in a stage before the transcribing, wherein a surface roughness measuring unit measures the surface roughness and includes (1) a measuring unit which measures the surface roughness of the adhesive layer formed on the medium in a non-contact manner and (2) a support member which supports the medium from a side of a face opposite to a face on which the adhesive layer is formed, when measuring the surface roughness of the adhesive layer, and wherein the support member is disposed at a position in which the medium is pressed toward the measuring unit by a predetermined amount, when measuring at least the surface roughness of the adhesive layer.

2. The manufacturing method of a joined body according to claim 1, wherein, in the measuring of surface roughness, the surface roughness on the adhesive layer formed on the medium is measured in a non-contact manner.

3. The manufacturing method of a joined body according to claim 1, wherein, in the transcribing, the transcribing is performed in a case in which the surface roughness of the adhesive layer is smaller than a predetermined value which is set in advance, in the measuring of surface roughness.

4. The manufacturing method of a joined body according to claim 1, wherein, in the transcribing, transcribing is performed in a case in which light receiving intensity of reflected light when radiating light toward the adhesive layer is larger than a predetermined value which is set in advance, in the measuring of surface roughness.

5. The manufacturing method of a joined body according to claim 1, wherein the measuring of surface roughness is performed between the forming of the adhesive layer and the adjusting of viscosity.

6. The manufacturing method of a joined body according to claim 1, wherein the measuring of surface roughness is performed between the adjusting of viscosity and the transcribing.

7. The manufacturing method of a joined body according to claim 1, wherein a thickness of the adhesive layer is measured together, in the measuring of surface roughness.

8. A manufacturing method of a MEMS device which includes a joined body in which a plurality of structures are joined to each other using an adhesive in a state of being stacked, the method comprising:
    manufacturing of a joined body using the manufacturing method of a joined body according to claim 1.

9. A manufacturing method of a liquid ejecting head which includes a joined body in which a plurality of structures are joined to each other using an adhesive in a state of being stacked, and a liquid flow path is formed in the inside, the method comprising:
    manufacturing of a joined body using the manufacturing method of a joined body according to claim 1.

10. A manufacturing device of a joined body in which a plurality of structures are joined to each other using an adhesive in a state of being stacked, the device comprising:
    an adhesive layer forming unit which forms an adhesive layer on one face of a medium;
    a viscosity adjusting unit which adjusts viscosity of the adhesive layer formed by the adhesive layer forming unit;
    a transcribing unit which transcribes the adhesive layer of which viscosity is adjusted by the viscosity adjusting unit to the structure; and
    a surface roughness measuring unit which measures surface roughness of the adhesive layer on the medium, wherein:
        the surface roughness measuring unit is disposed in front of the transcribing unit in a manufacturing line,
        the surface roughness measuring unit includes (1) a measuring unit which measures the surface roughness of the adhesive layer formed on the medium in a non-contact manner and (2) a support member which supports the medium from a side of a face opposite to a face on which the adhesive layer is formed, when measuring the surface roughness of the adhesive layer, and the support member has a curved face which curves toward the measuring unit.

11. The manufacturing device of a joined body according to claim 10, wherein the surface roughness measuring unit includes a measuring unit which measures the surface roughness of the adhesive layer formed on the medium in a non-contact manner, and a support member which supports the medium from a side of a face opposite to a face on which the adhesive layer is formed, when measuring the surface roughness of the adhesive layer.

12. The manufacturing device of the joined body according to claim 11, wherein the measuring unit includes an irradiation portion which radiates light and a light receiving portion which receives light, and
wherein the support member is provided with a through hole portion which is larger than a measuring spot necessary for measuring the surface roughness of the adhesive layer using the measuring unit, at a position corresponding to a position to which the light is radiated.

13. A manufacturing device of a joined body in which a plurality of structures are joined to each other using an adhesive in a state of being stacked, the device comprising:
an adhesive layer forming unit which forms an adhesive layer on one face of a medium;
a viscosity adjusting unit which adjusts viscosity of the adhesive layer formed by the adhesive layer forming unit;
a transcribing unit which transcribes the adhesive layer of which viscosity is adjusted by the viscosity adjusting unit to the structure; and
a surface roughness measuring unit which measures surface roughness of the adhesive layer on the medium, wherein:
the surface roughness measuring unit is disposed in front of the transcribing unit in a manufacturing line,
the surface roughness measuring unit includes (1) a measuring unit which measures the surface roughness of the adhesive layer formed on the medium in a non-contact manner and (2) a support member which supports the medium from a side of a face opposite to a face on which the adhesive layer is formed, when measuring the surface roughness of the adhesive layer, and
a support member moving mechanism which moves the support member to a position of supporting the medium by being in contact with the medium, and a position of being not in contact with the medium.

14. A manufacturing device of a joined body in which a plurality of structures are joined to each other using an adhesive in a state of being stacked, the device comprising:
an adhesive layer forming unit which forms an adhesive layer on one face of a medium;
a viscosity adjusting unit which adjusts viscosity of the adhesive layer formed by the adhesive layer forming unit;
a transcribing unit which transcribes the adhesive layer of which viscosity is adjusted by the viscosity adjusting unit to the structure; and
a surface roughness measuring unit which measures surface roughness of the adhesive layer on the medium, wherein:
the surface roughness measuring unit is disposed in front of the transcribing unit in a manufacturing line,
the surface roughness measuring unit includes (1) a measuring unit which measures the surface roughness of the adhesive layer formed on the medium in a non-contact manner and (2) a support member which supports the medium from a side of a face opposite to a face on which the adhesive layer is formed, when measuring the surface roughness of the adhesive layer,
the support member has a curved face which curves toward the measuring unit, and
the support member is at least a roller member which is rotatably provided in a transport direction of the medium.

* * * * *